(12) United States Patent
Aberbour

(10) Patent No.: US 10,725,078 B2
(45) Date of Patent: Jul. 28, 2020

(54) ELECTROMAGNETIC FIELD MEASUREMENT SYSTEM

(71) Applicant: ART-FI, Orsay (FR)

(72) Inventor: Lyazid Aberbour, Orsay (FR)

(73) Assignee: ART-FI, Orsay (FR)

( * ) Notice: Subject to any disclaimer, the term of this patent is extended or adjusted under 35 U.S.C. 154(b) by 201 days.

(21) Appl. No.: 16/067,408

(22) PCT Filed: Dec. 28, 2016

(86) PCT No.: PCT/EP2016/082759
§ 371 (c)(1),
(2) Date: Jun. 29, 2018

(87) PCT Pub. No.: WO2017/114854
PCT Pub. Date: Jul. 6, 2017

(65) Prior Publication Data
US 2019/0004100 A1    Jan. 3, 2019

(30) Foreign Application Priority Data

Dec. 29, 2015 (EP) .................................... 15307164

(51) Int. Cl.
*G01R 29/08* (2006.01)
(52) U.S. Cl.
CPC ..... *G01R 29/0814* (2013.01); *G01R 29/0878* (2013.01)
(58) Field of Classification Search
CPC .................................................. G01R 29/08; G01R 29/0814; G01R 29/0878; H01Q 1/526; H01Q 9/0457; H01Q 21/061
See application file for complete search history.

(56) References Cited

U.S. PATENT DOCUMENTS 6,359,596 B1 * 3/2002 Claiborne ................ H01Q 1/38
343/795
9,335,358 B2 * 5/2016 Derat ..................... G01R 29/08
(Continued)

FOREIGN PATENT DOCUMENTS

EP       2610628 A1    7/2013
WO    2011080332 A2    7/2011

OTHER PUBLICATIONS

International Search Report and Written Opinion dated Mar. 29, 2017, for International Patent Application No. PCT/EP2016/082759.

*Primary Examiner* — Son T Le
(74) *Attorney, Agent, or Firm* — Karceski IP Law, PLLC

(57) ABSTRACT

In an electromagnetic field measurement system, a probe substrate and a transmission line substrate form a T-shaped structure, where the probe substrate forms a cap and the transmission line substrate forms a stem of the T-shaped structure. The probe substrate includes a probe having a first probe element, a second probe element, and a reference plane. The first probe element and the second probe element are disposed so that there is an axis of symmetry between these probe elements, whereby the axis of symmetry is perpendicular to the transmission line substrate. The transmission line substrate includes a transmission line structure coupled to the probe. The transmission line structure separately guides the first probe signal and the second probe towards a measurement processing arrangement that can provide a measurement results on the basis of the first probe signal and the second probe signal.

15 Claims, 5 Drawing Sheets

(56) References Cited

U.S. PATENT DOCUMENTS

2011/0193566 A1* 8/2011 Nyshadhann ...... G01R 29/0878
  324/637
2013/0099119 A1    4/2013 Derat et al.

* cited by examiner

ELECTROMAGNETIC FIELD MEASUREMENT SYSTEM

CROSS-REFERENCE TO RELATED APPLICATIONS

This is a National Stage Entry into the United Sates Patent and Trademark Office from International PCT Patent Application No. PCT/EP2016/082759, having an international filing date of Dec. 28, 2016, which claims priority to European Patent Application No. 15307164.2, filed on Dec. 29, 2015, the entire contents of both of which are incorporated herein by reference.

FIELD OF THE INVENTION

An aspect of the invention relates to an electromagnetic field measurement system. The system may be used, for example, to determine a specific absorption rate (SAR). Another aspect of the invention relates to a method of measuring an electromagnetic field involving such a system.

BACKGROUND OF THE INVENTION

Patent publication WO 2011/080332 describes a system for measuring an electromagnetic field. The system comprises an antenna device disposed on a plane. The antenna device is arranged to provide a pair of signals representative of a pair of orthogonal components of the electromagnetic field. A printed circuit for signal transmission is orthogonally disposed with respect to the plane on which the antenna device is disposed. The printed circuit comprises a transmission line coupled to the antenna device to transmit the pair of signals provided by the antenna device towards a measurement module.

SUMMARY OF THE INVENTION

There is a need for a solution that allows an even more precise measurement of an electromagnetic field.

In order to better address this need, the following points have been taken into consideration. In a system for measuring an electromagnetic field, such as the one disclosed in WO 2011/080332, a scattering of the electromagnetic field may occur. In particular, a substrate comprising signal transmission lines may cause such scattering. A scattered electromagnetic field may emanate from this substrate and even enter into the substrate. The scattered electromagnetic field may induce interfering signals within the system.

An interfering signal may particularly affect a measurement signal that represents a component of the electromagnetic field that is parallel with the substrate comprising the signal transmission lines. The presence of this substrate may make a probe less sensitive to this component of the electromagnetic field than to a component that is perpendicular to the aforementioned substrate. The probe may provide a signal component representing this electromagnetic field component, but this signal component may be relatively weak. Consequently, an interfering signal that is superposed on this signal component, may affect precision of measurement to a relatively great extent.

In accordance with an aspect of the invention, there is provided an electromagnetic field measurement system, which is appended to the description. Another aspect of the invention concerns a method of measuring an electromagnetic field, which method involves the system described herein.

In a system in accordance with the invention, two probe elements are disposed so that there is an axis of symmetry between these probe elements, whereby the axis of symmetry is perpendicular to a substrate comprising transmission lines. One probe element may provide a signal that comprises a relatively weak component representative of an electromagnetic field component parallel with the aforementioned substrate. The other probe element may provide a signal that comprises this same relatively weak component but opposite in sign. Interfering signals induced by a scattered electromagnetic field that emanates from the aforementioned substrate will have the same sign. This relationship of signs allows an interference cancellation effect as regards to the electromagnetic field component that is parallel with the substrate comprising the signal transmission lines. A more precise measurement of the electromagnetic field can thus be achieved.

An embodiment of the invention may comprise one or more additional features, which are appended to the description.

For the purpose of illustration, a detailed description of some embodiments of the invention is presented with reference to accompanying drawings.

DETAILED DESCRIPTION

Figure 1:
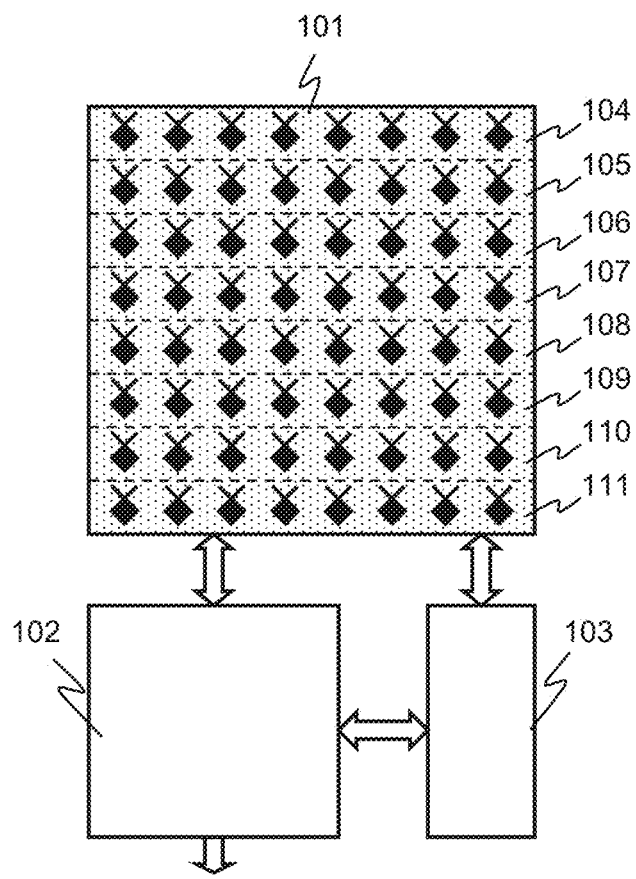
FIG. 1 is a block diagram of an electromagnetic field measurement system.

FIG. 1 schematically illustrates an electromagnetic field measurement system 100. The system 100 is represented in a block diagram. The electromagnetic field measurement system 100 may be used, for example, to determine a specific absorption rate (SAR). The electromagnetic field measurement system 100 comprises a field probing arrangement 101, a measurement processing arrangement 102, and a controller 103. The field probing arrangement 101 comprises a plurality of probe modules 104-111.

Figure 2:
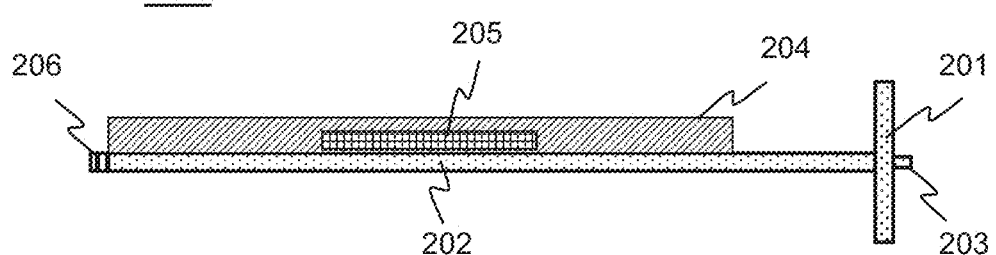
FIG. 2 is a schematic side view of a probe module in the electromagnetic field measurement system.

FIG. 2 schematically illustrates a probe module 200, which may correspond with any of the probe modules 104-111 in the electromagnetic field measurement system 100. This figure provides a schematic side view of the probe module 200. The probe module 200 comprises a probe substrate 201 and a transmission line substrate 202. The probe substrate 201 and the transmission line substrate 202 may be formed of, for example, commercially available printed circuit board material for electrical circuits.

The probe substrate 201 and a transmission line substrate 202 form a T-shaped structure. The transmission line substrate 202 forms a stem of this T-shaped structure, whereas the probe substrate 201 forms a cap of T-shaped structure. The transmission line substrate 202 is orthogonally disposed with respect to probe substrate 201. A probe coupling portion 203 of the transmission line substrate 202 may traverse the probe substrate 201 and extend there from, as illustrated in FIG. 2.

The transmission line substrate 202 may be provided with a cover 204 as illustrated in FIG. 2. The cover 204 may constitute an electromagnetic shield. To that end, the cover 203 may comprise, for example, electrically conductive elements. The transmission line substrate 202 may comprise a front-end circuit 205, which may be located under the cover 204. The transmission line substrate 202 may further be provided with a connector arrangement 206. The connector arrangement 206 may allow coupling of the probe module 200 to the measurement processing arrangement 102 and the controller 103 illustrated in FIG. 1.

Figure 3:
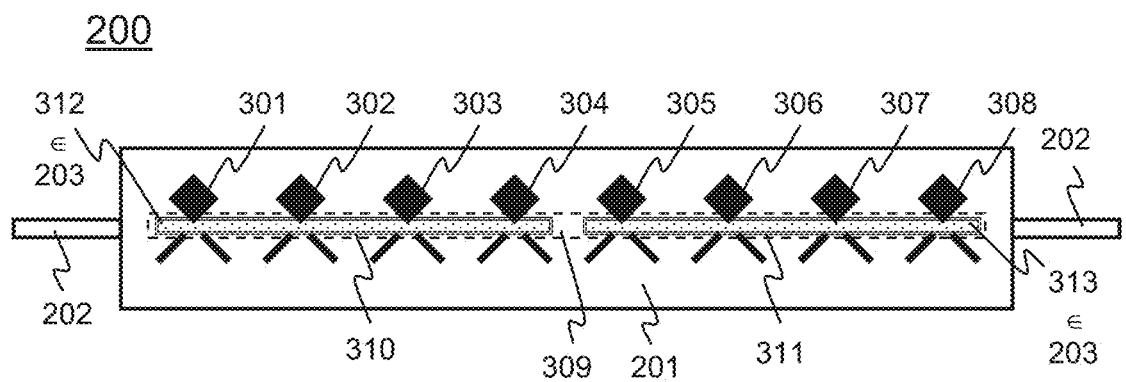
FIG. 3 is a schematic top view of the probe module.

FIG. 3 further schematically illustrates the probe module 200. This figure provides a schematic top view of the probe module 200. The probe substrate 201 comprises an array of probes 301-308, eight probes in this example. The probe substrate 201 may further comprise a slot arrangement 309 along which the probes 301-308 are disposed. The slot arrangement 309 intersects with the probes 301-308. The probe coupling portion 203 of the transmission line substrate 202 illustrated in FIG. 2 traverses the slot arrangement 309 in the probe substrate 201.

In this example, the slot arrangement 309 comprises two slots: a left slot 310 and right slot 311. Four probes 301-304 are disposed along the left slot 310, which intersects with each of these four probes 301-304. Four other probes 305-308 are disposed along the right slot 311, which intersects with each of these four probes 305-308. The probe coupling portion 203 of the transmission line substrate 202 comprises two probe coupling tabs: a left probe coupling tab 312 and a right probe coupling tab 313. The left probe coupling tab 312 traverses the left slot 310 in the probe substrate 201. The right probe coupling tab 313 traverses the right slot 311.

The front-end circuit 205 illustrated in FIG. 2 may comprise an arrangement of switches, which allows selection of a probe in the array of probes 301-308 so that this selected probe is electrically coupled to the connector arrangement 206. The connector arrangement 206 may receive a probe selection control signal, or any other control signal, from the controller 103 illustrated in FIG. 1.

Figure 4:
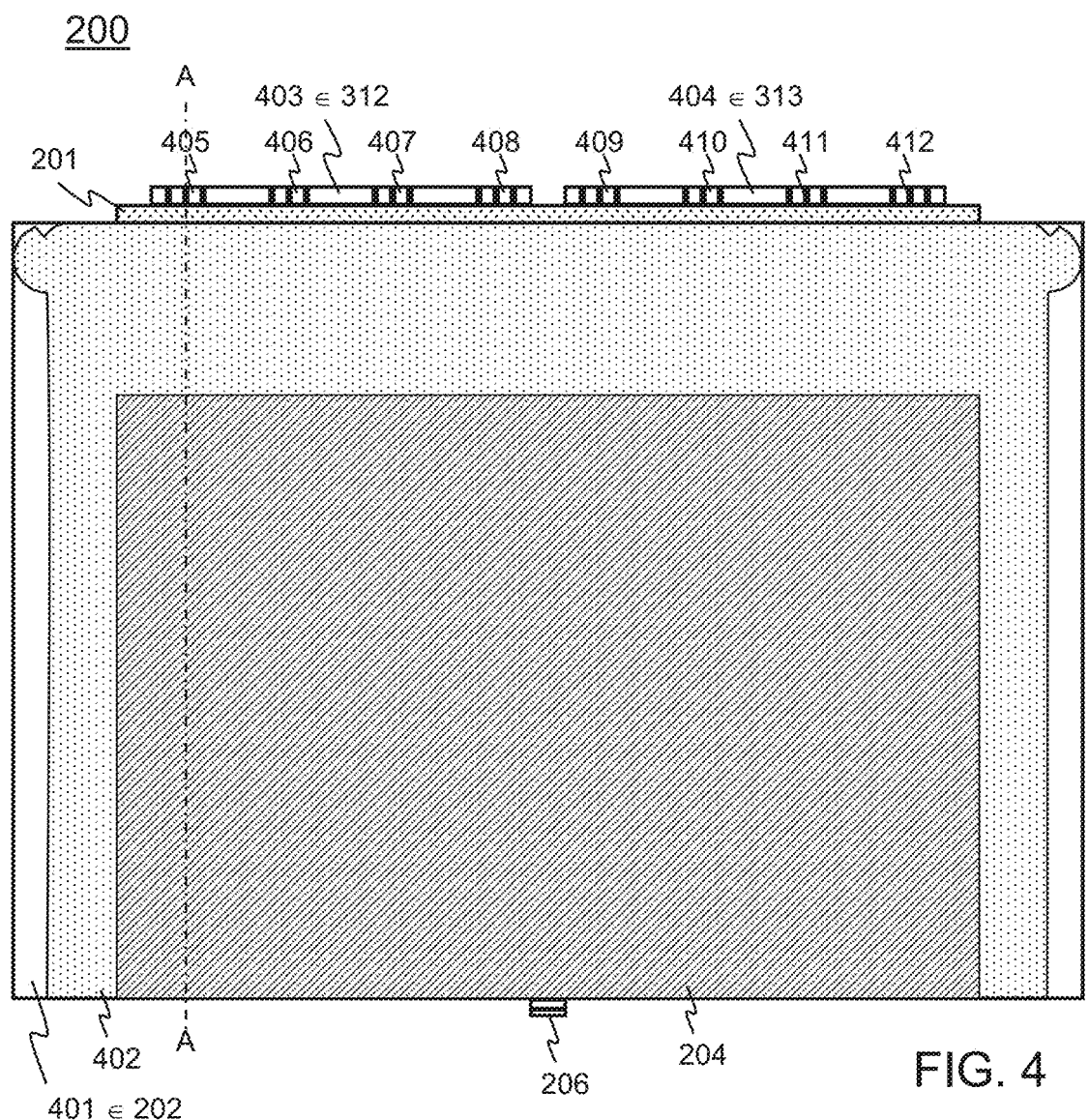
FIG. 4 is a schematic front view of the probe module.

FIG. 4 further schematically illustrates the probe module 200. This figure provides a schematic front view of the probe module 200. In this front view, a front face 401 of the transmission line substrate 202 is visible. This front face 401 comprises a shielding plane 402 of conductive material, which will hereinafter be referred to as front shielding plane 402 hereinafter. The front shielding plane 402 has a contour that may include two portions having a particular form that can be designated as "a parrot's beak". This particular form constitutes a choke for electromagnetic signals.

In FIG. 4, a main face 403 of the left probe coupling tab 312 is visible. This main face will hereinafter be referred to as left tab front face 403 for reasons of convenience and illustration. Similarly, a main face 404 of the right probe coupling 313 tab is visible, which will hereinafter be referred to right tab front face 404. The connector arrangement 206 and the cover 204 mentioned hereinbefore with reference to FIG. 2 are also visible in FIG. 4.

The left tab front face 403 comprises a plurality of conductive tongue groups 405-408. Similarly, the right tab front face 404 tab also comprises a plurality of conductive tongue groups 409-412. There is one conductive tongue group for each of the eight probes 301-308 illustrated in FIG. 3. A conductive tongue group comprises three conductive tongues: a left conductive tongue, a middle conductive tongue, and a right conductive tongue. In FIG. 4, each of these conductive tongues is represented as a relatively small black rectangular area.

Figure 5:
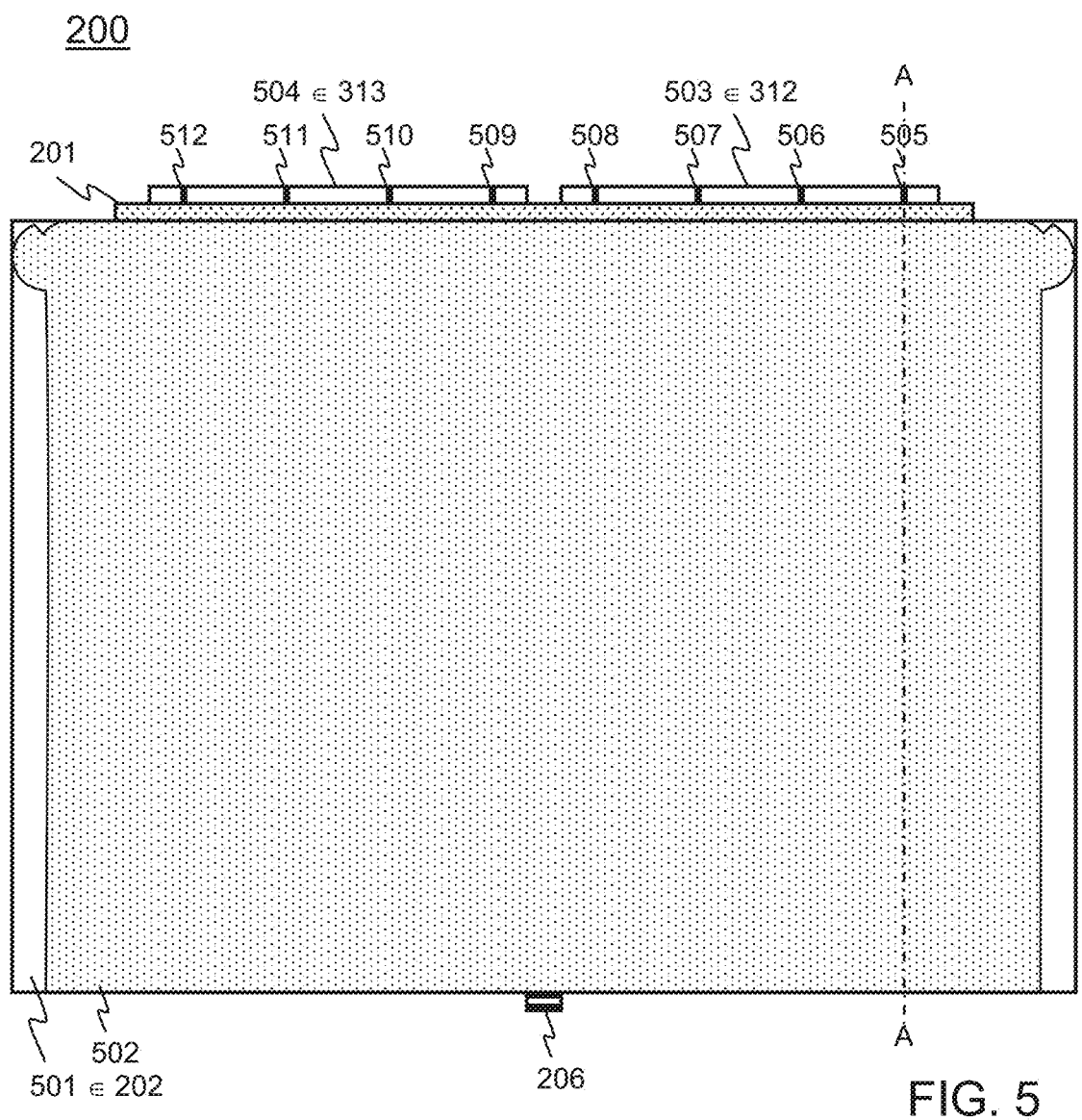
FIG. 5 is a schematic rear view of the probe module.

FIG. 5 further schematically illustrates the probe module 200. FIG. 5 provides a rear view of the probe module 200. In this rear view, a rear face 501 of the transmission line substrate 202 is visible. This rear face 501 also comprises a shielding plane 502 of conductive material, which will hereinafter be referred to as rear shielding plane 502. The rear shielding plane 502 is, at least partially, complementary with the front shielding plane 402 illustrated in FIG. 4. The rear shielding plane 502 has a contour that may also include two portions in the form of "a parrot's beak". These portions are similar and symmetrical compared to those present in front shielding plane 402 illustrated in FIG. 4.

In FIG. 5, another main face 503 of the left probe coupling tab 312 is visible. This other main face will hereinafter be referred to as a left tab rear face 503 for reasons of convenience and illustration. Similarly, another main face 504 of the right probe coupling 313 tab is visible, which will hereinafter be referred to right tab rear face 504. The connector arrangement 206 mentioned hereinbefore with reference to FIG. 2 is also visible in FIG. 5.

The left tab rear face 503 comprises a plurality of conductive tongues 505-509. Similarly, the right tab rear face 504 also comprises a plurality of conductive tongues 509-512. There is one conductive tongue for each of the eight probes 301-308 illustrated in FIG. 3.

Figure 6:
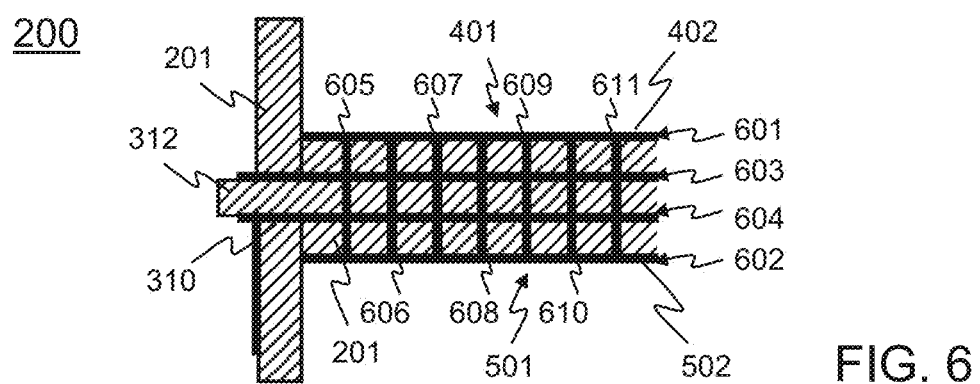
FIG. 6 is a schematic sectional view of an upper portion of the probe module, when cut along a plane indicated by a line A-A in FIGS. 4 and 5.

FIG. 6 schematically illustrates an upper portion of the probe module 200. This figure provides a schematic sectional view of the upper portion of the probe module 200, when cut along a plane indicated by a line A-A in FIGS. 4 and 5. In FIG. 6, the left slot 310 in the probe substrate 201 is visible, as well as the left probe coupling tab 312 of the transmission line substrate 202 that traverses this left slot 310.

FIG. 6 shows that the transmission line substrate 202 comprises a plurality of conductive layers 601-604, four in this example. More specifically, the transmission line substrate 202 comprises an outer conductive layer 601 on its front face 401 and another outer conductive layer 602 on its rear face 501. These outer conductive layers will hereinafter be referred to as front outer conductive layer 601 and rear outer conductive layer 602, respectively, for reasons of convenience and clarity. The front shielding plane 402 illustrated in FIG. 4 is comprised in the front outer conductive layer 601. The rear shielding plane 502 illustrated in FIG. 5 is comprised in the rear outer conductive layer 602.

The transmission line substrate 202 further comprises two inner conductive layers: an inner conductive layer 603 that is nearest to the front face 401 of the transmission line substrate 202 and another inner conductive layer 604 that is nearest to the rear face 501. These inner conductive layers will hereinafter be referred to as front-nearest inner conductive layer 603 and rear-nearest inner conductive layer 604, respectively, for reasons of convenience and clarity. FIG. 6 further shows that a plurality of through hole connections 605-611 extend between the four conductive layers 601-604 of the transmission line substrate 202. These will be discussed in greater detail hereinafter.

The description hereinbefore of the probe module 200 illustrated in FIG. 2 with reference to this figure and with reference to FIGS. 3 to 6 may thus apply to any of the probe modules 104-111 in the electromagnetic field measurement system 100 illustrated in FIG. 1.

Figure 7:
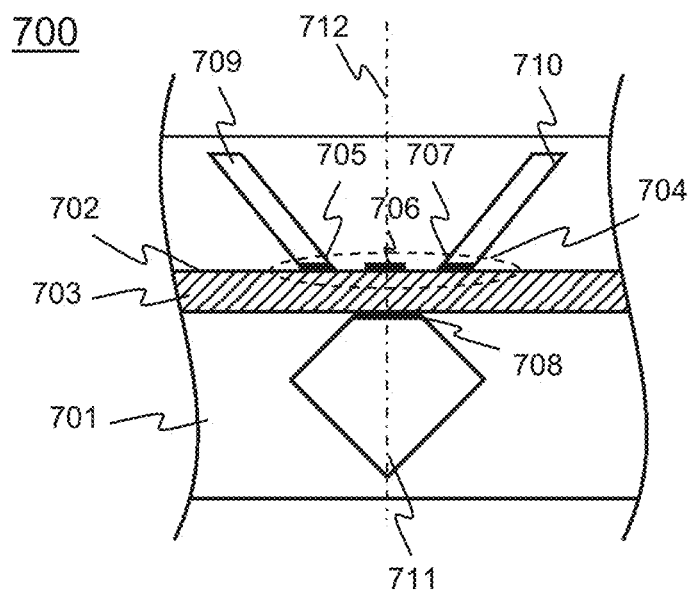
FIG. 7 is a schematic top view of a probe on a probe substrate in the probe module.

FIG. 7 schematically illustrates a probe 700, which may correspond with any of the probes 301-308 of the probe module 200 described hereinbefore with reference to FIGS. 2-6. FIG. 7 provides a schematic top view of a portion of a probe substrate 701 where the probe 700 is located. This probe substrate 701 may thus correspond with the probe substrate 201 illustrated in FIG. 3. The probe 700 illustrated in FIG. 7 is disposed along a slot 702, which may correspond with left slot 310 illustrated in FIG. 3, as well as with the right slot 311. A probe coupling tab 703 of a transmission line substrate extends through the slot 702, as shown in FIG. 7. In the sequel, it is assumed, for reasons of illustration, that this probe coupling tab 703 belongs to the transmission line substrate 202 described hereinbefore with reference to FIGS. 2-6. The probe coupling tab 703 shown in FIG. 7 may thus correspond with the left probe coupling tab 312 shown in FIG. 3, as well as with the right probe coupling tab 313.

As explained hereinbefore, the probe coupling tab 703 comprises, for the probe 700, a conductive tongue group 704 on its front face. The conductive tongue group 704 comprises a left conductive tongue 705, a middle conductive tongue 706, and a right conductive tongue 707, as shown in FIG. 7. The probe coupling tab 703 comprises, for the probe 700, a conductive tongue 708 on its rear face, as shown in FIG. 7. This conductive tongue will be referred to as rear conductive tongue 708 hereinafter.

The probe 700 comprises two conductive elements 709, 710 in the form of strips. These two conductive elements 709, 710 will hereinafter be referred to as left probe element 709 and right probe element 710, respectively, for reasons of convenience and clarity. The probe 700 further comprises a reference plane 711 of conductive material. The left probe element 709 and the right probe element 710 are disposed on a front side of the slot 702. The reference plane 711 is disposed on a rear side of the slot 702.

There is an axis of symmetry 712 between the left probe element 709 and the right probe element 710. This axis of symmetry 712 may be perpendicular to the transmission line substrate 202 and, more specifically, perpendicular to its front face 401 and its rear face 501. Furthermore, the left probe element 709 and the right probe element 710 may be disposed orthogonally with respect to each other. This implies that a longitudinal axis of the left probe element 709 has an angle of 45° with respect to the transmission line substrate 202. A longitudinal axis of the right probe element 710 also has an angle of 45°, but of opposite sign, with respect to the transmission line substrate 202.

The left probe element 709 may conductively be coupled to the left conductive tongue 705 on the front face of the probe coupling tab 703. The right probe element 710 may conductively be coupled to the right conductive tongue 707. The reference plane 711 may conductively be coupled to the rear conductive tongue 708.

The probe 700 illustrated in FIG. 7 may operate as follows in the presence of an electromagnetic field. The electromagnetic field induces a signal in the left probe element 709 with respect to the reference plane 711. This signal will hereinafter be referred to as left probe signal. The electromagnetic field induces another signal in the right probe element 710 with respect to the reference plane 711. This signal will hereinafter be referred to as right probe signal.

In more detail, the electromagnetic field may have two components that are orthogonal with respect to each other and that lie in a plane that coincides with the probe substrate 701. One component may be oriented in parallel with the transmission line substrate 202 and, more specifically, in parallel with its front face 401 and its rear face 501. This component will hereinafter be referred to as horizontal field component. The other component may then be oriented orthogonally which respect to the transmission line substrate 202. This component will hereinafter be referred to as vertical field component.

The transmission line substrate 202 may affect the horizontal field component to a greater extent than the vertical field component. This is because the transmission line substrate 202 comprises various conductive planes that are relatively large and in parallel with the horizontal field component. These conductive planes include the front shielding plane 402, which is shown in FIG. 4, and the rear shielding plane 502, which is shown in FIG. 5, as well as the cover 204, which is shown in FIGS. 2 and 4. These conductive planes may make the probe 700 relatively insensitivity to the horizontal field component.

In addition, the transmission line substrate 202 may cause scattering of the electromagnetic field. This scattering results in a scattered electromagnetic field that emanates from the transmission line substrate 202. The probe 700 may thus receive this scattered electromagnetic field in addition to the electromagnetic field to be measured. Moreover, the scattered electromagnetic field, or at least a portion thereof, may even enter into the transmission line substrate 202.

In these conditions, the left probe signal will then comprise several signal components. These signal components include a signal component that is induced by the horizontal field component of the electromagnetic field to be measured, and another signal component that is induced by the vertical field component. The one and the other signal component will hereinafter be referred to as horizontal signal component and vertical signal component, respectively, for reasons of convenience and clarity. The horizontal signal component and vertical signal component are desired signal components. In addition to these, the left probe signal will further comprise, within the transmission line substrate 202, a parasitic signal component that is induced by the scattered electromagnetic field.

The right probe signal will also comprise several components, which are similar to those described hereinbefore. That is, these signal components include a horizontal signal component, which is induced by the horizontal field component of the electromagnetic field to be measured, and a vertical signal component, which is induced by the vertical field component. In addition to these desired signal components, the right probe signal will further also comprise, within the transmission line substrate 202, a parasitic signal component that is induced by the scattered electromagnetic field. This parasitic signal component will typically be similar to that in the left probe signal. The one and the other parasitic signal component, which are induced by the scattered electromagnetic field, will therefore hereinafter be referred to as common mode interference signal component.

The aforementioned respective horizontal signal components, in the left probe signal and in the right probe signal, are typically relatively weak. This is because the probe 700 is less sensitive to the horizontal field component than to the vertical field component due to the presence of the transmission line substrate 202, as explained hereinbefore.

In the probe 700, as illustrated in FIG. 7, the left probe element 709 and the right probe element 710 are disposed so that the vertical signal component in the left probe signal may correspond with the vertical signal component in the right probe signal, both in terms of magnitude and sign. The horizontal signal component in the left probe signal may also correspond with the horizontal signal component in the right probe signal in terms of magnitude. However, these two aforementioned signal components are of opposite sign. In this example, it is assumed that the horizontal signal component in the left probe signal has a positive sign, whereas the horizontal signal component in the right probe signal has a negative sign. The common mode interference signal component in the left probe signal corresponds with the common mode interference signal component in right probe signal.

This disposition of the left probe element 709 and the right probe element 710 contributes to achieving improved measurement precision. For example, a measurement signal that represents the horizontal field component with relatively great precision can be obtained by subtracting the left probe signal from the right probe signal, or vice versa. This subtraction provides an interference cancellation effect. The common mode interference signal component in the left probe signal and the common mode interference signal component in the right probe signal cancel each other out, at least to a certain extent. The respective vertical signal components in the left probe signal and the right probe signal also cancel each other out as a result of the subtraction. What is left is a sum of the respective horizontal signal components in the left probe signal and the right probe signal. This sum constitutes a horizontal field measurement signal.

The disposition of the left probe element 709 and the right probe element 710 thus allows an interference reduction for the respective horizontal signal components that these probe elements provide. This interference reduction is particularly appropriate because these horizontal signal components are relatively weak, as explained hereinbefore. In contrast, the respective vertical signal components are relatively strong. These can thus tolerate, as it were, a higher level of interference than the horizontal signal components. An interference cancellation effect is less required. A measurement signal that represents the vertical field component with sufficient precision can be obtained by summing the left probe signal and the right probe signal. This summing provides no interference cancellation effect.

The front-end circuit 205 on the probe module 200 illustrated in FIG. 2 may subtract the right probe signal from the left probe signal in order to obtain a horizontal measurement signal, which represents a horizontal component of the electromagnetic field that is parallel with the transmission substrate line substrate. The front-end circuit 205 may further add the left probe signal and the right probe signal to obtain a vertical measurement signal that represents a vertical component of the electromagnetic field that is perpendicular to the transmission line substrate 202. In another embodiment, these operations, subtraction and addition, may be carried out in the measurement processing arrangement 102 of the electromagnetic field measurement system 100 illustrated in FIG. 1.

The description hereinbefore of the probe 700 illustrated in FIG. 7 with reference to this figure may thus apply to any of the probes 301-308 in the probe module 200 illustrated in FIG. 3, and thus to any of the probes in the probe modules 104-111 in the electromagnetic field measurement system 100 illustrated in FIG. 1.

Figure 8:
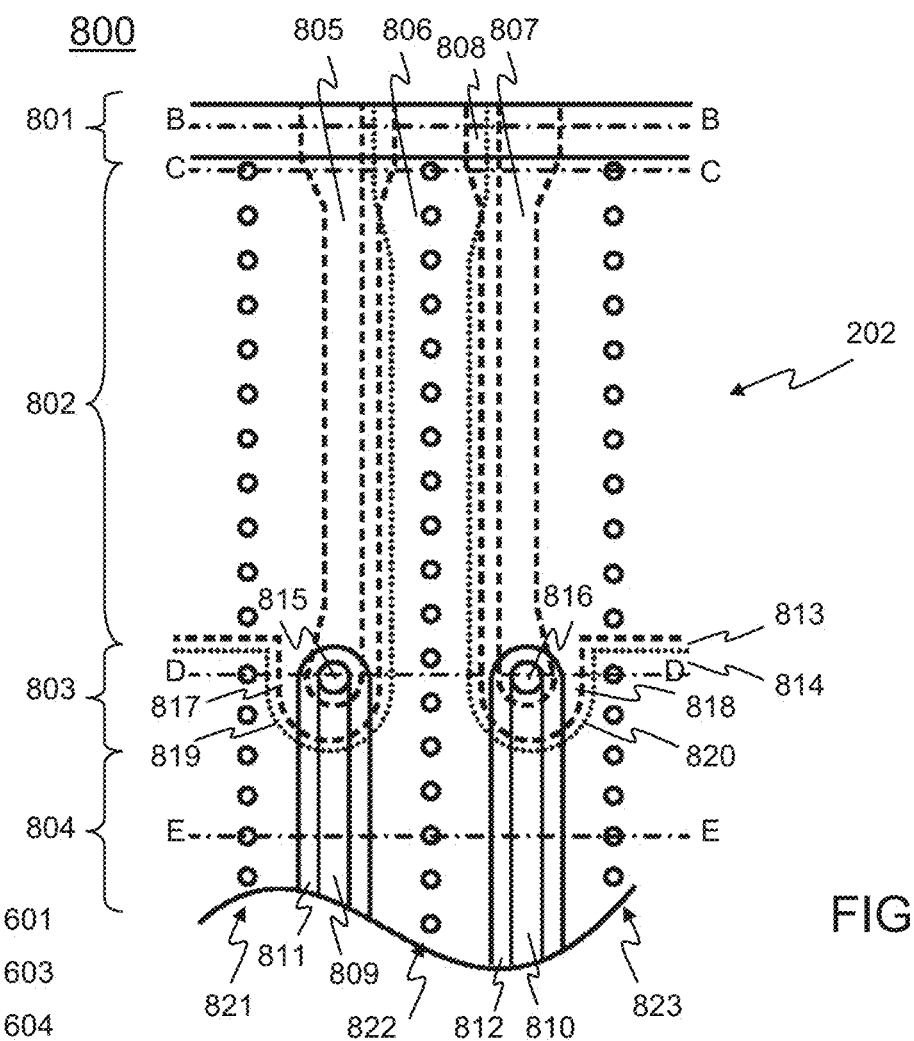
FIG. 8 is a schematic semi-transparent top view of a transmission line structure in a transmission line substrate in the probe module.

FIG. 8 schematically illustrates a transmission line structure 800 in the transmission line substrate 202 of the probe module 200. This figure provides a schematic semi-transparent top view of the transmission line structure 800, whereby the cover 204 shown in FIGS. 2 and 4 is omitted. FIG. 8 comprises different types of lines to represent features in the different conductive layers 601-604 of the transmission line substrate 202 shown in FIG. 6. Solid lines represent features in the front outer conductive layer 601. Dashed lines represent features in the front-nearest inner conductive layer 603. Dotted lines represent features in the rear-nearest inner conductive layer 604. Relatively small circles in solid lines represent through-hole connections. FIG. 8 furthers shows several dot-dashed lines. A dot-dashed line indicates a plane along which a cut can be made to obtain a sectional view.

The transmission line structure 800 has several sections: a probe coupling section 801, a head section 802, a transition section 803, and a micro-strip line section 804. The probe coupling section 801 lies in the probe coupling portion 203 of the transmission line substrate 202 illustrated in FIG. 3. The micro-strip line section 804 may extend to the front-end circuit 205 illustrated in FIG. 2. The micro-strip line section 804 may be located, at least partially, under the cover 204, which is omitted in FIG. 8 for reasons of clarity. The cover 204 may constitute an electromagnetic shield for the micro-strip line section 804.

In the probe coupling section 801, the head section 802, and, partially, the transition section 803, the transmission line structure 800 comprises three conductive strips 805, 806, 807 in the front-nearest inner conductive layer 603. For reasons of convenience and clarity, one of these three conductive strips will hereinafter be referred to as left front inner conductive strip 805, another one as middle front inner conductive strip 806, and yet another one as right front inner conductive strip 807. In the aforementioned sections, the transmission line structure 800 further comprises a conductive strip in the rear-nearest inner conductive layer 604. This conductive strip will hereinafter be referred to as rear inner conductive strip 808 for reasons of convenience and clarity. In the front view that FIG. 8 provides, the rear inner conductive strip 808 is located under the middle front inner conductive strip 806.

In the micro-strip line section 804 and, partially, the transition section 803, the transmission line structure 800 comprises two conductive strips 809, 810 in the front outer conductive layer 601. For reasons of convenience and clarity, one of these two conductive strips will hereinafter be referred to as left outer conductive strip 809, the other one as right outer conductive strip 810. The left outer conductive strip 809 lies within a finger-shaped opening 811 in the front shielding plane 402, which is also comprised in the front outer conductive layer 601 of the transmission line structure 800. Similarly, the right outer conductive strip 810 also lies within a finger-shaped opening 812 in the front shielding plane 402.

In the micro-strip line section 804 and, partially, the transition section 803, the transmission line structure 800 further comprises two conductive planes 813, 814 that are conductively coupled to signal ground. One of these conductive planes 813 is comprised in the front-nearest inner conductive layer 603 of the transmission line structure 800. The other conductive plane 814 is comprised in the rear-nearest inner conductive layer 604. The one and the other conductive plane will hereinafter be referred to as front inner ground plane 813 and rear inner ground plane 814, respectively, for reasons of convenience and clarity.

The middle front inner conductive strip 806, which is present in the head section 802, extends from the front inner ground plane 813, which is present in the micro-strip line section 804, in a fashion similar to a finger that extends from a hand. Similarly, the rear inner conductive strip 808, which is present in the head section 802, extends from the rear inner ground plane 814, which is present in the micro-strip line section 804.

In the transition section 803, the transmission line structure 800 comprises two though hole connections 815, 816. One through-hole connection 815 conductively couples the left front inner conductive strip 805 and the left outer conductive strip 809 with each other. The other through-hole connection 816 conductively couples the right front inner conductive strip 807 and the right outer conductive strip 810 with each other. The one and the other through-hole connection will hereinafter be referred to as left transition through-hole connection 815 and right transition through-hole connection 816, respectively, for reasons of convenience and clarity.

In the transition section 803, the front inner ground plane 813 has two U-shaped openings 817, 818: one that is located around the left transition through-hole connection 815, and another that is located around the right transition through-hole connection 816. The one and the other U-shaped opening will hereinafter be referred to as left front inner U-shaped opening 817 and right front inner U-shaped opening 818, respectively, for reasons of convenience and clarity. The rear inner ground plane 814 has two similar U-shaped openings: one that is located around the left transition through-hole connection 815, and another one that is located around the right transition through-hole connection 816. The one and the other U-shaped opening will hereinafter be referred to as left rear inner U-shaped opening 819 and right rear inner U-shaped opening 820.

The transmission line structure 800 provides a signal path that allows transmission of a left probe signal from a probe, such as the probe 700 illustrated in FIG. 7, to the font-end circuit illustrated in FIG. 2. This left signal path comprises the left front inner conductive strip 805, the left transition through-hole connection 815, and the left outer conductive strip 809. Symmetrically, the transmission line structure 800 further provides a signal path that allows transmission of a right probe signal from the probe 700 concerned to the front-end circuit 205 illustrated in FIG. 2. This right signal path comprises the right front inner conductive strip 807, the right transition through-hole connection 816, and the right outer conductive strip 810.

The transmission line structure 800 may further comprise various arrays of through-hole connections 821, 822, 823 that extend between the front shielding plane 401 and the rear shielding plane 501. These arrays include a left array of through-hole connections 821, a middle array of through-hole connections 822, and a right array of through-hole connections 823.

The left array of through-hole connections 821 constitutes a shielding fence between the two aforementioned signal paths and signal paths of a left adjacent transmission line structure, or another potential source of interference. Similarly, the right array of through-hole connections 823 constitutes a shielding fence between the two signal paths and signal paths of a right adjacent transmission line structure, or another potential source of interference. The middle array of through-hole connections 822 constitutes a shielding fence between the left signal path and the right signal path of the transmission line structure 800 itself. This counters cross talk between these signal paths. The left probe signal and the right probe signal remain properly separated.

Figure 9:
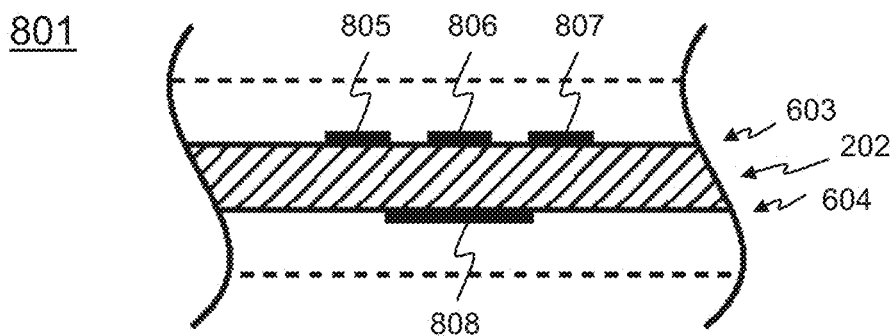
FIG. 9 is a schematic sectional view of a probe coupling section in the transmission line structure, when cut along a plane indicated by a line B-B indicated in FIG. 8.

FIG. 9 further schematically illustrates the probe coupling section 801 in the transmission line structure 800. This figure provides a sectional view of the probe coupling section 801 when cut along a plane indicated by a line B-B indicated in FIG. 8. The probe coupling section 801 is comprised in a thinned projecting portion of the transmission line substrate 202. This thinned projecting portion forms a probe coupling tab, such as the left probe coupling tab 312, the right probe coupling tab 313 illustrated in FIGS. 3 to 5, or the probe coupling tab 703 illustrated in FIG. 7. In the thinned projecting portion of the transmission line substrate 202, the front-nearest inner conductive layer 603 and the rear-nearest inner conductive layer 604 constitute outer layers, as illustrated in FIG. 9.

The probe coupling section 801 comprises a head portion of the left front inner conductive strip 805. This head portion may constitute a left conductive tongue, such as the left conductive tongue 705 illustrated in FIG. 7. The probe coupling section 801 further comprises a head portion of the right front inner conductive strip 807. This head portion may constitute a right conductive tongue, such as the right conductive tongue 707 illustrated in FIG. 7. The probe coupling section 801 may further comprise a head portion of middle front inner conductive strip 806. This head portion may constitute a middle conductive tongue, such as the middle conductive tongue 706 illustrated in FIG. 7. The probe coupling section 801 may further comprise a head portion of the rear inner conductive strip 808. This head portion may constitute a rear conductive tongue, such as the rear conductive tongue 708 illustrated in FIG. 7.

Figure 10:
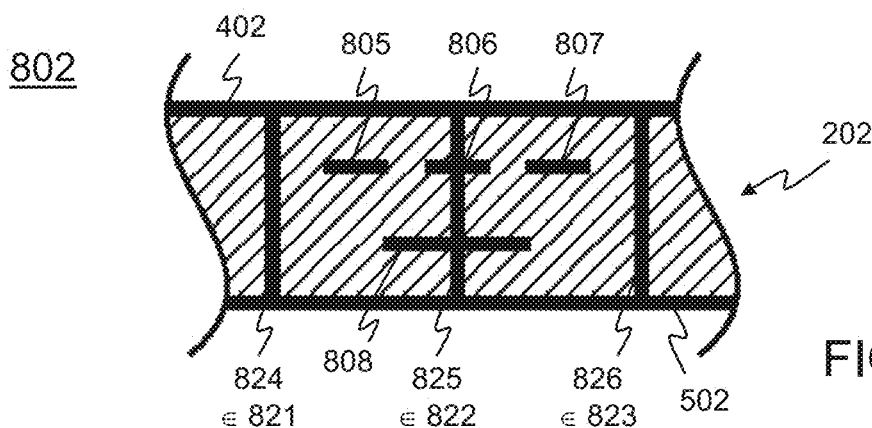
FIG. 10 is a schematic sectional view of a head section in the transmission line structure, when cut along a plane indicated by a line C-C indicated in FIG. 8.

FIG. 10 further schematically illustrates the head section 802 in the transmission line structure 800. This figure provides a sectional view of the head section 802 when cut along a plane indicated by a line C-C indicated in FIG. 8. This cut plane passes through the front shielding plane 402, the rear shielding plane 502, and three through-hole connections: one 824 belonging to the left array of through-hole connections 821, another one 825 belonging to the middle array 822, and yet another 826 one belonging to the right array 823. Accordingly, these elements are shown and referenced in FIG. 10.

The head section 802 comprises a main portion of the left front inner conductive strip 805, a main portion of the middle front inner conductive strip 806, and a main portion of the right front inner conductive strip 807. The head section 802 further comprises a main portion of the rear inner conductive strip 808. These conductive strips are thus shown and referenced in FIG. 10.

In the head section 802, the through-hole connection 825 of the middle array 822 conductively couples the following elements with each other: the front shielding plane 402, the middle front inner conductive strip 806, the rear inner conductive strip 808, and the rear shielding plane 502. The same may apply to the other through-hole connections of the middle array 822 that are located in the head section 802. The aforementioned elements are conductively coupled to signal ground. The through-hole connections of the left array 821 and the right array 823 conductively couple the front shielding plane 402 and rear shielding plane 502 with each other. The same may apply to the other through-hole connection of these arrays 821, 823.

In the head section 802, the aforementioned conductive strips 805-808 may have a particular spatial relationship with respect to each other and with respect to the front shielding plane 402 and the rear shielding plane 502. This particular spatial relationship is so that, in the head section 802, the left signal path has a characteristic impedance that is in a desired range. The same applies to the right signal path.

Figure 11:
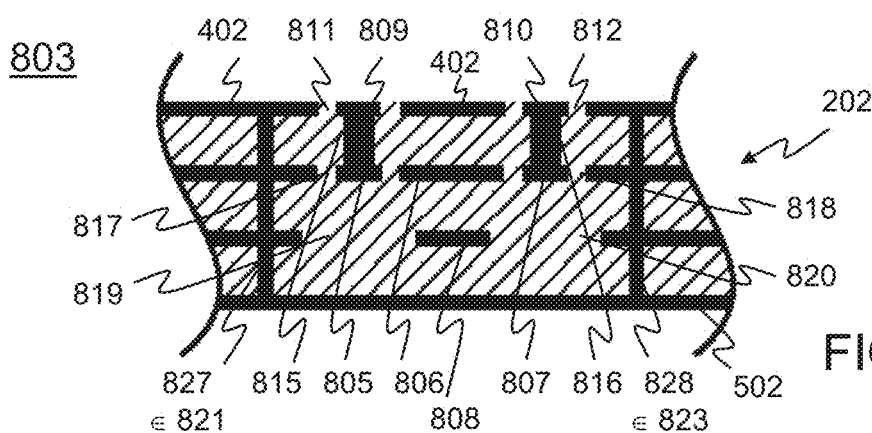
FIG. 11 is a schematic sectional view of a transition section in the transmission line structure, when cut along a plane indicated by a line D-D indicated in FIG. 8.

FIG. 11 further schematically illustrates the transition section 803 in the transmission line structure 800. This figure provides a sectional view of the transition section 803, when cut along a plane indicated by a line D-D indicated in FIG. 8. This cut plane passes through the front shielding plane 402, the rear shielding plane 502, as well as through a through-hole connection 827 belonging to the left array 821 and a through-hole connection 828 belonging to the right array 823. Accordingly, these elements are shown and referenced in FIG. 11.

The transition section 803 comprises a tail portion of the left front inner conductive strip 805, a tail portion of the middle front inner conductive strip 806, and a tail portion of the right front inner conductive strip 807. The transition section 803 further comprises a base portion of the rear inner conductive strip 808. The transition section 803 further comprises a head portion of the left outer conductive strip 809 and a head portion of the right outer conductive strip 810, which both extend into the micro-strip line section 804. These conductive strips 803-810 are thus shown and referenced in FIG. 11

FIG. 11 further shows the left transition through-hole connection 815, as well as the left front inner U-shaped opening 817 and the left rear inner U-shaped opening 819 that are located around this through-hole connection 815. This figure further shows the right transition through-hole connection 816, as well as the right front inner U-shaped opening 818 and the right rear inner U-shaped opening 820 that are located around this through-hole connection 816. FIG. 11 further shows the finger-shaped opening 811 in the front shielding plane 402 in which the left outer conductive strip 809 lies, as well as the finger-shaped opening 812 in which the right outer conductive strip 810 lies.

Figure 12:
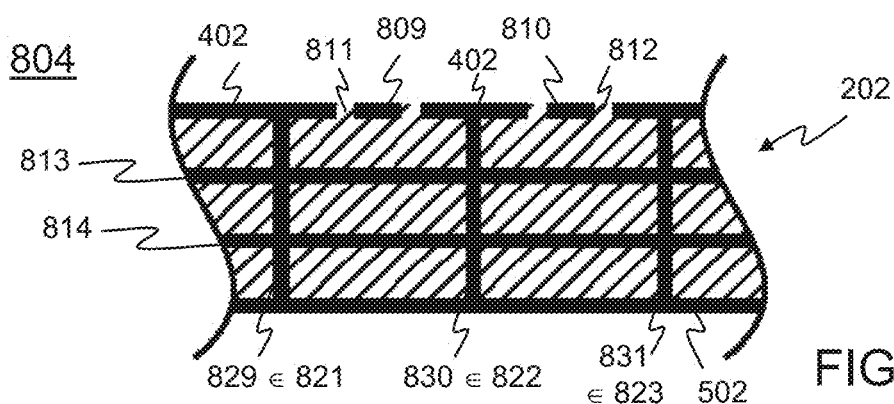
FIG. 12 is a schematic sectional view of a micro-strip line section in the transmission line structure, when cut along a plane indicated by a line E-E indicated in FIG. 8.

FIG. 12 further schematically illustrates the micro-strip line section 804 in the transmission line structure 800. This figure provides a sectional view when cut along a plane indicated by a line E-E indicated in FIG. 8. This cut plane passes through the front shielding plane 402, the front inner ground plane 813, the rear inner ground plane 814, and the rear shielding plane 502, as well as three through-hole connections: one 829 belonging to the left array of through-hole connections 821, another one 830 belonging to the middle array, and yet another one 831 belonging to the right array. Accordingly, these elements are shown and referenced in FIG. 12.

FIG. 12 shows the left outer conductive strip 809, as well as the finger-shaped opening 811 in the front shielding plane 402 in which this conductive strip lies. This figure further shows the right outer conductive strip 810, as well as the finger-shaped opening 812 in the front shielding plane 402 in which this conductive strip lies.

In the micro-strip line section 804, the aforementioned conductive strips may 809, 810 may have a particular spatial relationship with respect to the front inner ground plane 813, and also with respect to the front shielding plane 402. This particular spatial relationship is so that, in the micro-strip line section 804, the left signal path has a characteristic impedance that is also in the desired range. Moreover, this characteristic impedance may match sufficiently well the characteristic impedance in the head section 802. The same remarks applying to the right signal path in the head section 802 and in the micro-strip line section 804.

The description hereinbefore of the transmission line structure 800 illustrated in FIG. 8 and described with reference to this figure and with reference to FIGS. 9 to 12 may apply to any transmission line structure in the transmission line substrate 202 of the probe module 200 illustrated in FIGS. 2 to 6. This description may also apply to any transmission line structure in a transmission line substrate of any of the probe modules 104-111 in the electromagnetic field measurement system 100 illustrated in FIG. 1.

The electromagnetic field measurement system 100 illustrated in FIG. 1 may basically operate as follows. For reasons of illustration, it is assumed that the probe modules 104-111 are each similar to the probe module 200 described hereinbefore with reference to FIGS. 2 to 6. The probe modules 104-111 may define a measurement surface, which is formed by the probe substrates of the probe modules 104-111. It is further assumed that the probes in the probe modules 104-111 are each similar to the probe 700 described hereinbefore with reference to FIG. 7. Each probe may have a unique location on the measurement surface. The probes may be disposed as a two-dimensional grid in which a probe constitutes a grid point. It is further assumed that each transmission line structure for each probe is similar to the transmission line structure 800 described hereinbefore with reference to FIGS. 8 to 12.

The field probing arrangement 101 may be placed in a physical model of a human body part, such as, for example, a human head. The physical model may comprise a substance that has dielectric properties similar to those of biological tissue in the body part concerned. Patent publication WO 2013/079621 describes such a substance. An electromagnetic field emitting device, such as, for example, a cellular phone, is placed near the physical model. This device under test is made to produce an electromagnetic field that will penetrate the physical model. The probes in the field probing arrangement 101 will receive the electromagnetic field that has penetrated.

In the conditions described hereinbefore, a probe will provide a left probe signal and a right probe signal as described hereinbefore with reference to the probe 700 illustrated in FIG. 7. Referring to FIG. 2, the front-end circuit 205 of the probe module 200 in which the probe is comprised may process the left probe signal and the right probe signal so to obtain a pair of measurement signals related to the probe. For example, the front-end circuit 205 may subtract the right probe signal from the left probe signal, or vice versa, and may further add these two signals, as described hereinbefore. As another example, the front-end circuit 205 may merely amplify the left probe signal and the right probe signal in which case the pair of measurement signals comprises an amplified version of the left probe signal and an amplified version of the right probe signal.

In any case, the pair of measurement signals represents two orthogonal components of the electromagnetic field at the location of the probe. These two orthogonal components lie in a plane that coincides with the probe substrate in which the probe is comprised. This plane also coincides with the aforementioned measurement surface.

The measurement processing arrangement 102 processes respective measurements signals that the field probing arrangement 101 provides. The measurement processing arrangement 102 detects an amplitude and a phase of one and the other component of the electromagnetic field at respective locations of respective probes to which the respective measurements signals relate. The measurement processing arrangement 102 thus establishes an amplitude and phase map of the electromagnetic field on the measurement surface.

Once the two-dimensional amplitude and phase map of the electromagnetic field has been established, the measurement processing arrangement 102 may then generate a three-dimensional model of the electromagnetic field around the measurement surface on the basis of this map. This three-dimensional model allows determining a specific absorption rate with regard to the device under test. The measurement processing arrangement 102 may operate according to principles that have been described in patent publications WO 2011/080332 and EP 2 610 628.

The detailed description hereinbefore with reference to the drawings is merely an illustration of the invention and the additional features, which are defined herein. The invention can be implemented in numerous different ways. In order to illustrate this, some alternatives are briefly indicated.

The invention may be applied in numerous types of products or methods related to measuring an electromagnetic field. For example, the invention may, in principle, be applied in any type of product adapted to make a two-dimensional measurement of an electromagnetic field and to construct a three-dimensional representation of this field on the basis of this two-dimensional measurement using amplitude and phase information comprised therein.

The invention may be implemented in numerous different manners. Probe elements need not necessarily be disposed orthogonally with respect to each other. For example, there may be an angle of 60° between the probe elements. Two signals representative of two orthogonal components of the electromagnetic field may be obtained by making two linear combinations of two probe signals with appropriate weighing coefficients. Furthermore, a probe may comprise probe elements having any suitable shape, which need not necessarily have the shape of a strip. A similar remark applies to the conductive reference plane, which need not necessarily have the shape of a rectangle or a square. For example, in an alternative embodiment the conductive reference plane may have the shape of a circle or an ellipse.

There are numerous different ways of making two linear combinations of two probe signals so as to obtain two signals representative of two orthogonal components of the electromagnetic field. A set of two linear combinations may generally be expressed as follows:

$$U_A = \alpha_1 * U_L + \beta_1 * U_R \quad (1)$$

$$U_B = \alpha_2 * U_L - \beta_2 * U_R \quad (2)$$

wherein $U_A$ and $U_B$ represent a pair of signals representative of two orthogonal components of the electromagnetic field, $U_L$ represents the left probe signal, $U_R$ represents the right probe signal, $\alpha_1$, $\beta_1$ represent weighing factors for the left probe signal and the right probe signal, respectively, in the first linear combination (1), and $\alpha_2$, $\beta_2$ represent weighing factors for the left probe signal and the right probe signal, respectively, in the second linear combination (2). A set of two linear combinations is thus characterized by a set of four weighing coefficients $\alpha_1$, $\beta_1$, $\alpha_2$, $\beta_2$, which may have appropriate values so that the pair of signals correctly represents two orthogonal components of the electromagnetic field. The appropriate values depend on how the two probe elements are disposed with respect to each other. The detailed description provides an example wherein the four weighing coefficients are each equal to 1, which correspond with a non-weighted subtraction and a non-weighted addition. These are appropriate values because, in the example, the two probe elements 709, 710 shown in FIG. 7 are disposed orthogonally with respect to each other. There are numerous other sets of weighing coefficients values for which, in this example, $U_A$ and $U_B$ correctly represent a pair of signals representative of two orthogonal components of the electromagnetic field. For example, $\alpha_1=1$, $\beta_1=0$, $\alpha_2=0$, $\beta_2=1$, constitutes another set of weighing coefficient values for which $U_A$ and $U_B$ correctly represent two orthogonal components of the electromagnetic field.

There are numerous different ways of implementing a probe substrate. For example, a probe substrate may comprise a two-dimensional array of probes. Such a probe substrate may replace the plurality of probe substrates 104-111 shown in FIG. 1, which may each comprise a one-dimensional array of probes, such as the probe substrate 200 shown in FIG. 3. In another embodiment, a probe substrate may comprise a single probe only.

There are numerous different ways of implementing a transmission line substrate. For example, such a substrate may comprise three conductive layers only, or more than four conductive layers. For example, one or more additional conductive layers may be provided to facilitate an implementation of a front end circuit.

In general, there are numerous different ways of implementing the invention, whereby different implementations may have different topologies. In any given topology, an entity may carry out several functions, or several entities may jointly carry out a single function. In this respect, the drawings are very diagrammatic. There are numerous functions that may be implemented by means of hardware or software, or a combination of both. A description of a software-based implementation does not exclude a hardware-based implementation, and vice versa. Hybrid implementations, which comprise one or more dedicated circuits as well as one or more suitably programmed processors, are also possible. For example, various functions described hereinbefore with reference to the figures may be implemented by means of one or more dedicated circuits, whereby a particular circuit topology defines a particular function.

There are numerous ways of storing and distributing a set of instructions, that is, software, which allows measuring an electromagnetic field in accordance with the invention. For example, software may be stored in a suitable device readable medium, such as, for example, a memory circuit, a magnetic disk, or an optical disk. A device readable medium in which software is stored may be supplied as an individual product or together with another product, which may execute the software. Such a medium may also be part of a product that enables software to be executed. Software may also be distributed via communication networks, which may be wired, wireless, or hybrid. For example, software may be distributed via the Internet. Software may be made available for download by means of a server. Downloading may be subject to a payment.

The remarks made hereinbefore demonstrate that the detailed description with reference to the drawings is an illustration of the invention rather than a limitation. The invention can be implemented in numerous alternative ways that are within the scope of the appended claims. All changes that come within the meaning and range of equivalency of the claims are to be embraced within their scope. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that respective dependent claims define respective additional features, does not exclude combinations of additional features other than those reflected in the claims.

The invention claimed is:

1. An electromagnetic field measurement system, comprising:
   a probe substrate comprising a probe having a first probe element, a second probe element and a reference plane, wherein an electromagnetic field induces a first probe signal in the first probe element with respect to the reference plane and a second probe signal in the second probe element with respect to the reference plane; and
   a transmission line substrate comprising a transmission line structure coupled to the probe and adapted to separately guide the first probe signal and the second probe signal towards a measurement processing arrangement adapted to provide measurement results on the basis of the first probe signal and the second probe signal;
   wherein the probe substrate and the transmission line substrate form a T-shaped structure, the probe substrate forming a cap and the transmission line substrate forming a stem of the T-shaped structure; and
   wherein the first probe element and the second probe element are disposed so that there is an axis of symmetry between these probe elements, the axis of symmetry being perpendicular to the transmission line substrate.

2. The electromagnetic field measurement system according to claim 1, wherein the transmission line structure comprises a head section comprising:
   a first conductive strip conductively coupled to the first probe element;
   a second conductive strip conductively coupled to the second probe element; and
   an intermediate conductive strip disposed between the first conductive strip and the second conductive strip, the intermediate conductive strip being conductively coupled to the reference plane of the probe.

3. The electromagnetic field measurement system according to claim 2, wherein the first conductive strip and the second conductive strip are sandwiched between two conductive shielding planes, the two conductive shielding planes being conductively coupled to the reference plane.

4. The electromagnetic field measurement system according to claim 3, wherein a shielding fence is disposed between the first conductive strip and the second conductive strip, the shielding fence being formed by an array of through-hole connections that conductively couple the two conductive shielding planes and the intermediate conductive strip with each other.

5. The electromagnetic field measurement system according to claim 4, comprising two further shielding fences between which the first conductive strip and the second conductive strip are disposed, the two further shielding fences being formed by an array of though hole connections that conductively couple the two conductive shielding planes with each other.

6. The electromagnetic field measurement system according to claim 2, wherein the transmission line structure comprises a micro-strip line section and a head section being intermediate between the probe and the micro-strip line section, the micro-strip line section comprising:
   a third conductive strip in the micro-strip line section conductively coupled to the first conductive strip in the head section;
   a fourth conductive strip in the micro-strip line section conductively coupled to the second conductive strip in the head section; and
   a ground plane disposed in parallel with the third conductive strip and with the fourth conductive strip in the micro-strip line section and facing these conductive strips, the ground plane being conductively coupled to the intermediate conductive strip in the head section.

7. The electromagnetic field measurement system according to claim 6, wherein the transmission line substrate comprises:
   a first conductive layer comprising a first conductive shielding plane of two conductive shielding planes;
   a second conductive layer comprising the first conductive strip, the second conductive strip and the intermediate conductive strip in the head section; and
   a third conductive layer comprising a second conductive shielding plane of the two conductive shielding planes.

8. The electromagnetic field measurement system according to claim 7, wherein:
   the first conductive layer comprises the third conductive strip and fourth conductive strip in the micro-strip line section of the transmission line structure;
   the second conductive layer comprises the ground plane in the micro-strip line section; and
   the transmission line substrate comprises a first through hole connection and a second through hole connection that conductively couple the third conductive strip and the second fourth conductive strips in the micro-strip line section to the first conductive strip and the second conductive strip in the head section of the transmission line structure, respectively.

9. The electromagnetic field measurement system according to claim 1, wherein:
   the probe substrate comprises a slot; and
   the transmission line substrate comprises a probe coupling tab that traverses the slot in the probe substrate.

10. The electromagnetic field measurement system according to claim 9, wherein the first probe element and the second probe element are disposed on one side of the slot, the reference plane being disposed on another, opposite side of the slot.

11. The electromagnetic field measurement system according to claim 1, wherein the first probe element and the second probe element are orthogonally disposed with respect to each other.

12. The electromagnetic field measurement system according to claim 1, wherein a circuit is adapted to add the first probe signal to the second probe signal and to subtract the first probe signal from the second probe signal.

13. The electromagnetic field measurement system according to claim 1, comprising a plurality of probe modules, wherein the probe substrate and the transmission line substrate jointly form one of the plurality of probe modules, the others of the plurality of probe modules being similar.

14. The electromagnetic field measurement system according to claim 13, wherein respective probes of the plurality of probe modules are disposed as a two-dimensional grid in which the each respective probe constitutes a grid point.

15. A method of measuring an electromagnetic field involving the electromagnetic field measurement system according to claim 1.

* * * * *